(12) United States Patent
Ranish et al.

(10) Patent No.: US 6,376,804 B1
(45) Date of Patent: Apr. 23, 2002

(54) SEMICONDUCTOR PROCESSING SYSTEM WITH LAMP COOLING

(75) Inventors: Joseph M. Ranish, San Jose; Andreas G. Hegedus, Burlingame, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/595,758

(22) Filed: Jun. 16, 2000

(51) Int. Cl.[7] ................................................ F27D 11/00
(52) U.S. Cl. ...................... 219/390; 219/405; 219/411; 392/416; 118/724; 118/725
(58) Field of Search ................................ 219/390, 405, 219/411; 392/416, 418; 118/724, 725, 50.1

(56) References Cited

U.S. PATENT DOCUMENTS

| | | | |
|---|---|---|---|
| 4,649,261 A | | 3/1987 | Sheets .......................... 219/390 |
| 5,156,820 A | * | 10/1992 | Wong et al. ............. 422/186.05 |
| 5,345,534 A | | 9/1994 | Najm et al. .................... 392/422 |
| 5,755,886 A | * | 5/1998 | Wang et al. .................. 118/715 |
| 5,937,142 A | | 8/1999 | Moslehi et al. .............. 392/416 |
| 6,121,581 A | | 9/2000 | Hegedus |
| 6,190,458 B1 | * | 2/2001 | Harada ........................ 118/715 |

* cited by examiner

Primary Examiner—Philip H. Leung
Assistant Examiner—Shawntina Fuqua
(74) Attorney, Agent, or Firm—Pennie & Edmonds, LLP

(57) ABSTRACT

A semiconductor processing system includes a process chamber and an assembly of radiant energy sources. The radiant energy assembly is filled with a thermally conductive gas to cool the radiant energy sources.

19 Claims, 4 Drawing Sheets

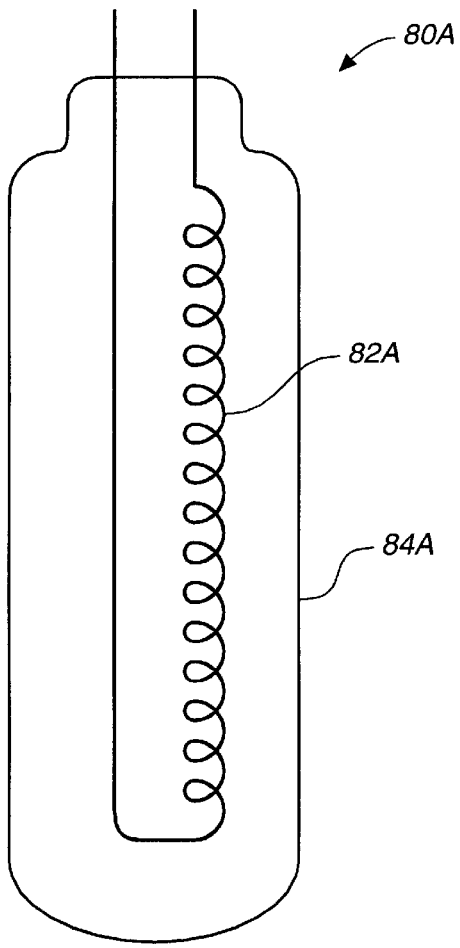 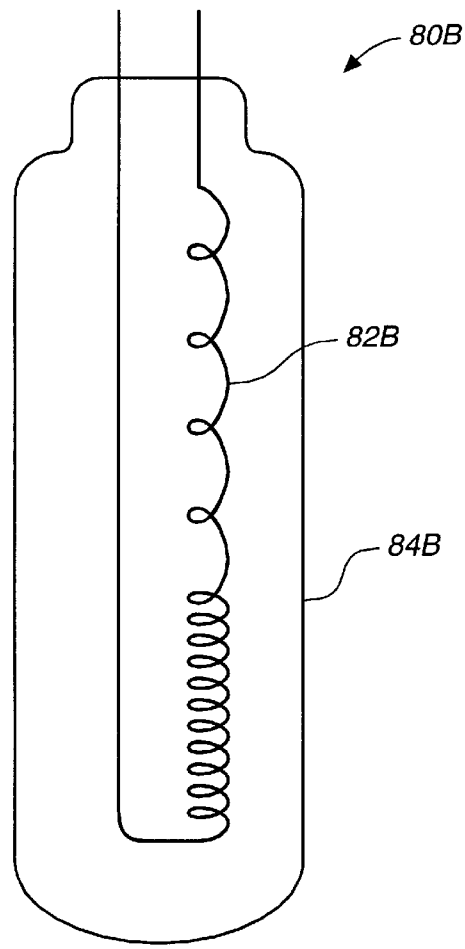
FIG._1A     FIG._1B

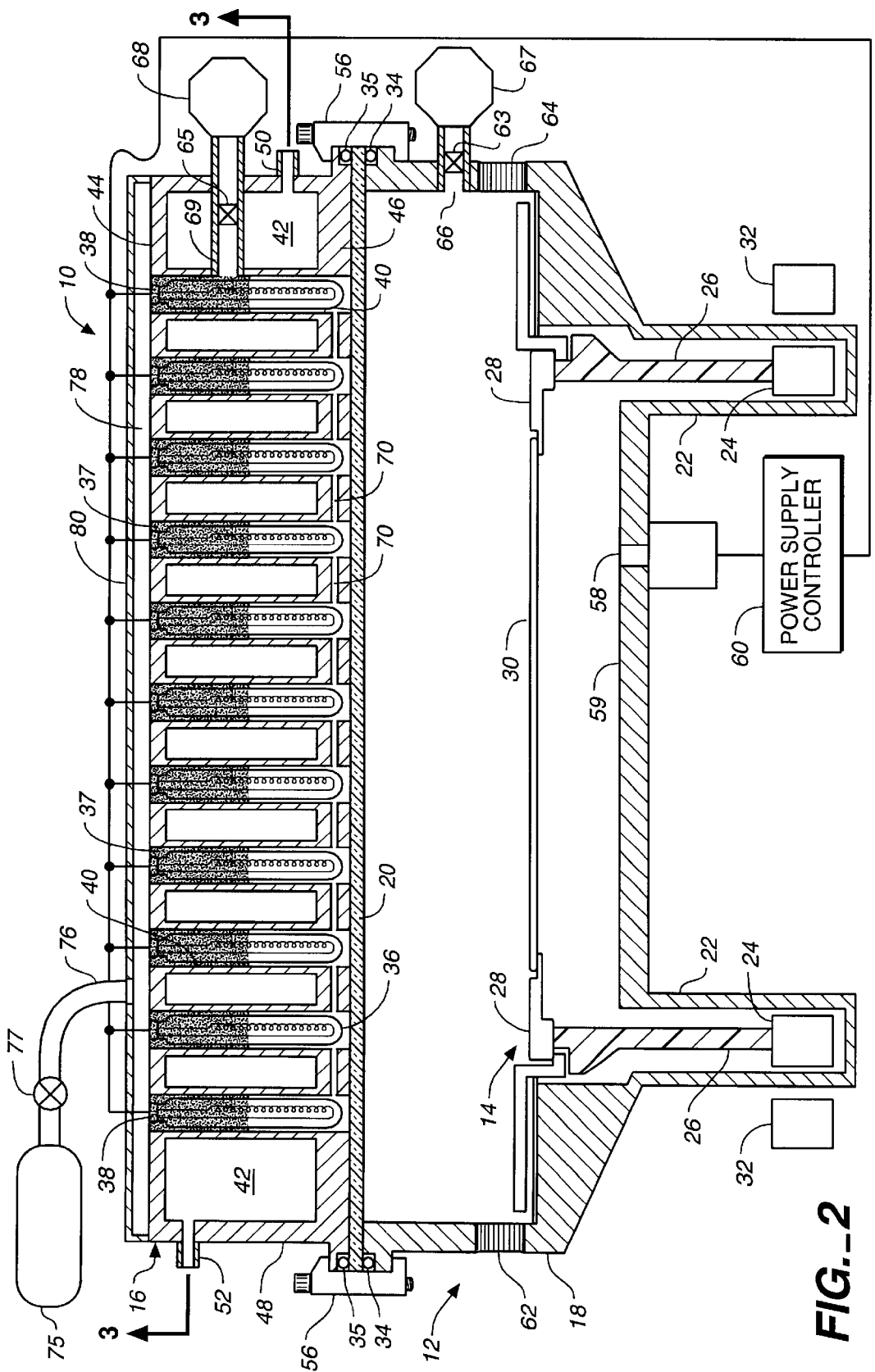
FIG._2

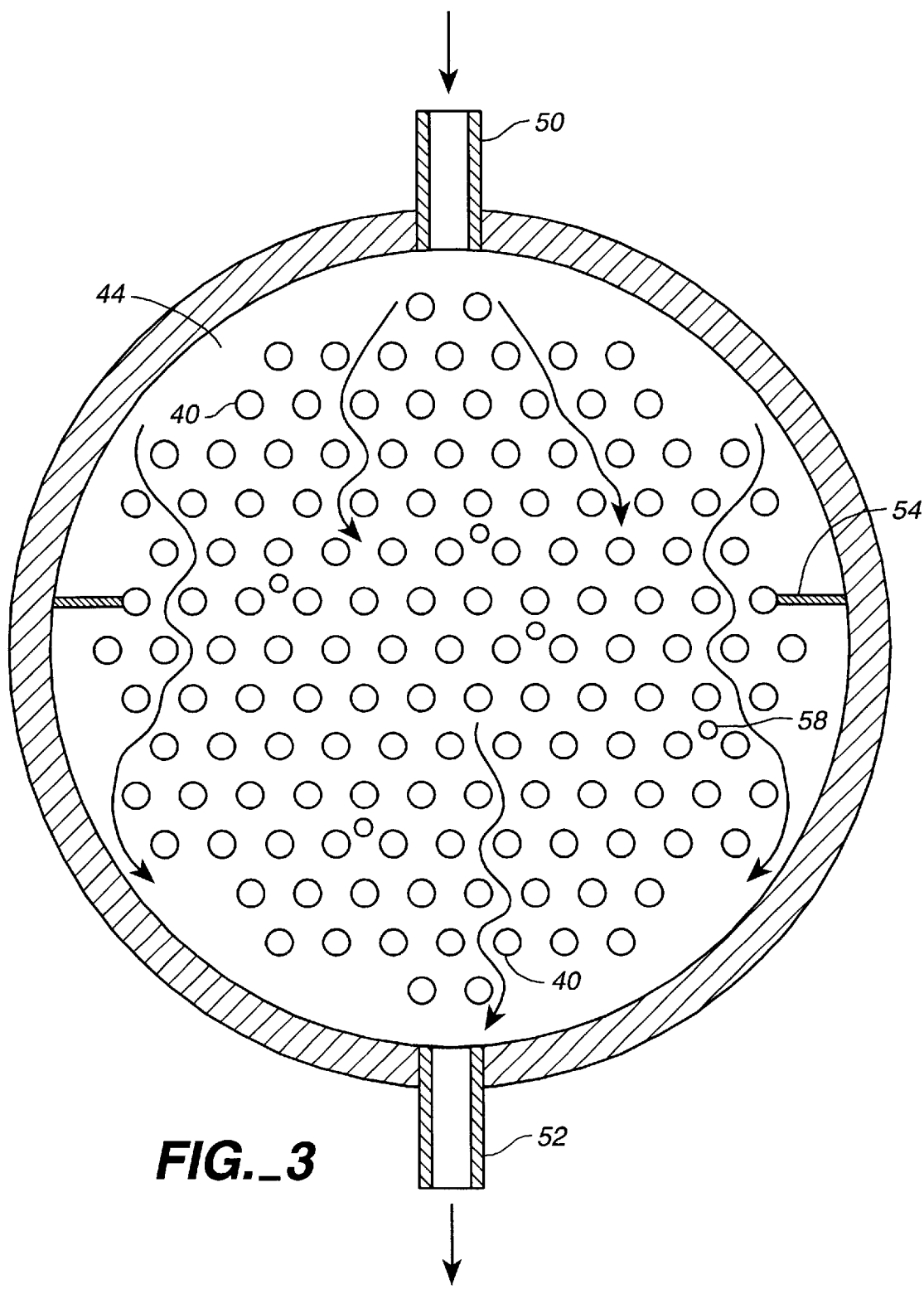
FIG._3

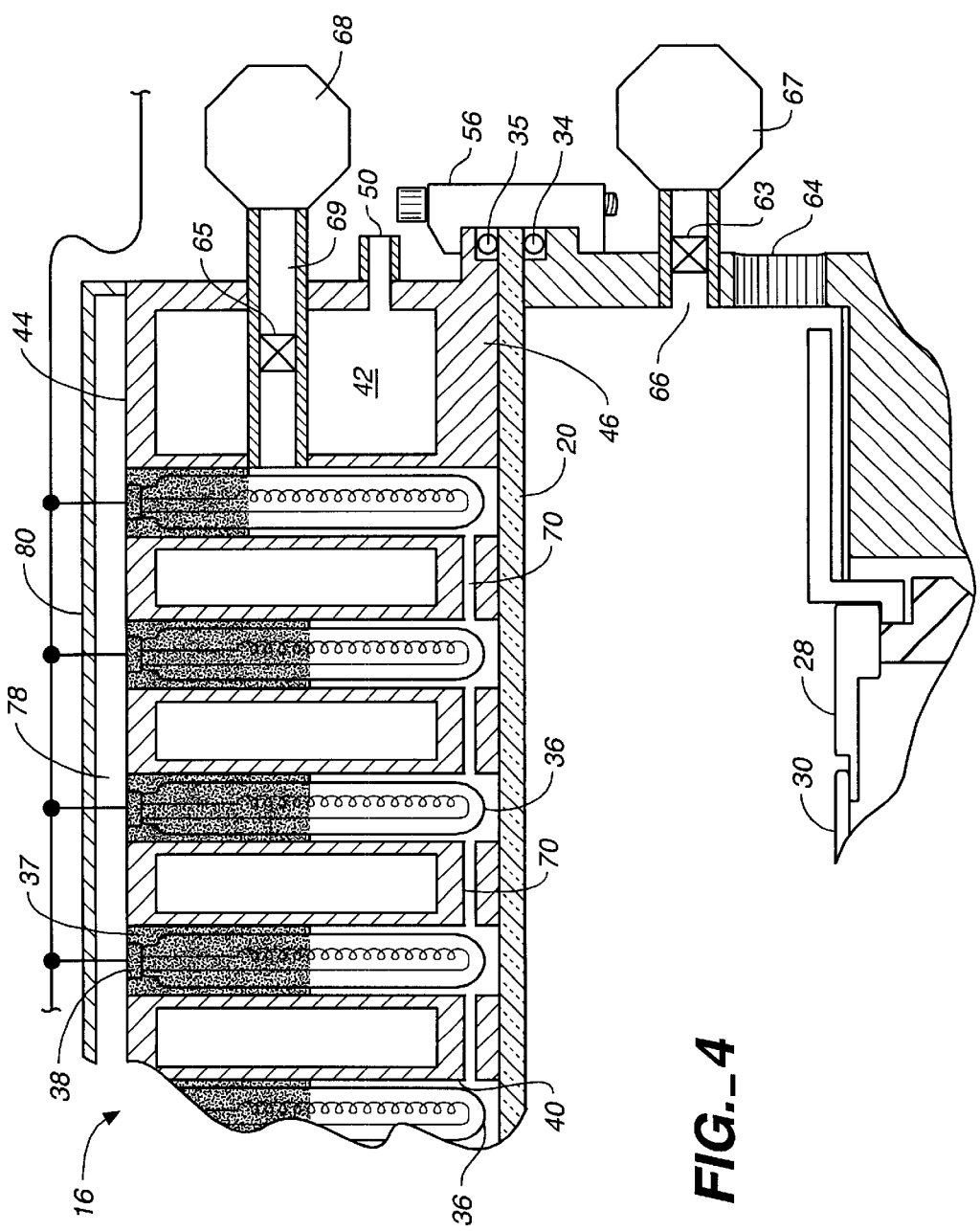
FIG._4

SEMICONDUCTOR PROCESSING SYSTEM WITH LAMP COOLING

BACKGROUND OF THE INVENTION

This invention relates generally to a semiconductor processing system and, more specifically, to a semiconductor processing system having a processing chamber and a heat source assembly.

Rapid thermal processing (RTP) systems are employed in semiconductor chip fabrication to create, chemically alter or etch surface structures on semiconductor wafers. One such RTP system, as described in U.S. Pat. No. 5,155,336, includes a semiconductor processing chamber and a lamphead or heat source assembly located on the semiconductor processing chamber.

The semiconductor-processing chamber may be fitted with an adapter plate for low pressure operation. The adapter plate includes a lower quartz window, an upper quartz window and a strengthening component, which is sandwiched between the lower and upper windows. The strengthening component may be made of stainless steel and comprises two spaced plates and a surrounding ring, which jointly define an enclosed volume. A plurality of tubes are welded into holes in the plates to form light passageways.

A number of infrared lamps are located in the lamphead. During processing, infrared radiation from the lamps radiate through the upper window, the light passageways and the lower window onto a wafer in the processing chamber. In this manner, the wafer is heated to a required processing temperature.

During processing, the pressure within the processing chamber may be at a sub-atmospheric pressure, and the lamps may be operated cyclically. The cyclic operation can take place at different voltage profiles depending upon the process.

SUMMARY OF THE INVENTION

In general, the invention is directed to a semiconductor processing system. In one aspect, the invention features a process chamber having a window and a support on which a substrate may be positioned during processing. An assembly of radiant energy sources is located on a side of the window opposite from that of the support to direct radiant energy through the window and onto a substrate on the support. The radiant energy assembly can be filled with a thermally conductive gas to cool the radiant energy sources.

In another aspect, the invention is directed to an apparatus for processing a substrate. The apparatus includes a chamber having at least one wall and a window sealed to the at least one wall of the chamber. A heat source assembly including a plurality of radiant energy sources is provided to radiate regions of the substrate within the chamber with a pattern of radiation intensity. The heat source assembly is sealed to the window and means are provided for filling the heat source assembly with a thermally conductive gas, such as helium, to cool the radiant energy sources.

In yet another aspect, the invention features a system for rapid thermal processing of a substrate. The system includes a process chamber having a window, and an assembly of radiant energy sources and reflectors disposed outside of the process chamber adjacent to the window. The assembly directs radiant energy through the window onto a substrate in the process chamber. A gas source is provided to fill the assembly with a thermally conductive gas to cool the radiant energy sources.

The gas source may be a pressurized source of helium gas. A vacuum pump can be used to evacuate the radiant energy assembly. The reflectors can extend into a cooling chamber through which a coolant can be circulated. The interior spaces of the reflectors are in fluid communication with each other.

Among the advantages of the invention are that the onset of the sag-arc-out failure mode is delayed, and the life of the radiant energy sources is extended.

Other features and advantages of the invention will be apparent from the following detailed description, the accompanying drawings and the claims.

BRIEF DESCRIPTION OF THE DRAWINGS

The invention is further described by way of examples with reference to the accompanying drawings wherein:

FIG. 1A depicts a lamp that has not experienced failure, and FIG. 1B depicts a lamp that has experienced sag and is about to fail by arc-out.

FIG. 2 is schematic side view of a semiconductor processing system according to the invention.

FIG. 3 is a sectional view of the semiconductor processing system taken along line 3—3 of FIG. 2.

FIG. 4 is an enlarged view of a portion of the semiconductor processing system of FIG. 2.

DETAILED DESCRIPTION OF THE INVENTION

A semiconductor processing system including a lamphead or heat source assembly and a semiconductor-processing chamber are described. In the following description, specific details are set forth in order to provide a thorough understanding of the invention. It will be appreciated, however, by one skilled in the art, that the invention may be practiced without these specific details. In other instances, well-known elements have not been shown in order to avoid unnecessarily obscuring the invention.

The use of incandescent lights in RTP applications requires operating the lamps cyclically. This kind of use can result in a life-limiting failure mechanism called "recipe-induced sag-arc-out failure." In such applications, the lamp is normally operated in base-up position (that is, with the base of the lamp above the tip of the lamp). FIGS. 1A and 1B depict two lamps 80A and 80B, respectively. Lamp 80A has not experienced failure. Lamp 80A includes a filament 82A, including a plurality of coils, that is housed within a lamp bulb 84A that is commonly composed of quartz.

Lamp 80B is a similar lamp that has experienced sag and is close to failing by arc-out. Lamp 80B also includes a filament 82B enclosed within a quartz bulb 84B. In sag-arc-out failure, the upper coils of the filaments stretch or sag, and operate at excessively high temperatures. Due to the sag, the lower coils stack. Due to the proximity of the lower coils to each other, the lower coils short out. This increases the voltage across the top coils, causing lamp failure.

The severity of the sag-arc-out failure mode depends upon the voltage profile applied to the lamphead during the lamp cycle. This voltage profile is known as a "recipe." For some recipes, sag-arc-out is not a main failure mode. One such recipe is simple on-off cycling. For these recipes, other failure modes occur well before the onset of the sag-arc-out failure mode. For other recipes, such as certain saturation-soaking profiles used in some RTP applications, sag-arc-out failure is the main failure mode and causes lamp failure well before the normally predicted life of the lamp. A saturation-soaking profile, by way of explanation, involves operating the lamphead at a low voltage for a first time period and then linearly ramping the lamphead to a high voltage for a second time period. This latter period is the saturation portion of the profile. The lamphead voltage is then linearly ramped down to an intermediate voltage for a third time period. This time period is the soaking portion of the profile. This third time period is the soaking portion of the profile. The lamphead voltage is then reduced back to its low voltage.

The most likely mechanism of recipe induced sag-arc-out failure is large bubble growth within the filament. Coalescence or growth of large bubbles on transverse grain boundaries is known to cause sag by grain rotation or slide. Factors which increase bubble growth include higher coil temperatures, large temperature gradients, higher stresses, different wire types, manufacture and processing conditions, and the addition of oxygen to the lamp fill gas.

One hypothesis for the recipe induced sag-arc-out failure mechanism involves an oxygen transport cycle. During the low power, low coil temperature part of an RTP cycle, oxygen-containing compounds in the gas phase release oxygen, which may be dissolved into or on the surface of the coil. During the higher power, higher coil temperature part of the RTP cycle, this oxygen causes abnormal bubble growth while simultaneously being driven out of the coil. Large bubbles on the transverse grain boundaries lead to lamp failure as described above.

If this hypothesis is correct, lowering the lamp oxygen content, especially during the low temperature parts of the recipe, should result in lower sag-arc-out failure rates. Reducing the lamp wall temperature may allow oxygen-containing compounds to condense on the wall of the lamp, thus reducing the total oxygen content of the lamp atmosphere. In one implementation, the lamphead is filled with a thermally conductive gas, such as helium. Helium has a much higher thermal conductivity than air. Thus, the presence of helium greatly increases the rate of heat transport from the lamp walls to the water-cooled lamphead. The pressure of the helium gas may be between about 3 and 10 torr. However, the pressure of the helium is not critical. The lamps should be cooled so that the average lamp wall temperature is reduced to below 700° C.

It has been determined empirically that lamp life is increased by a factor of nine by reducing the lamp wall temperature below 700° C. Some of the life increase is simply due to the coil operating at a lower temperature, and there is no self-heating from the reflector sleeve. However, lamp life is extended substantially beyond what would be expected from simple coil cooling.

Furthermore, the use of a thermally conductive gas within the lamphead to improve lamp bulb wall cooling allows the use of higher power coils within the system. The gas keeps the bulb walls within the temperature range for normal operation. The upper limit of the bulb wall temperature for normal operation is determined by a combination of water release from the quartz bulb wall, oxygen permeability of the quartz bulb wall, and the strain point of the quartz bulb wall.

As shown in FIGS. 2 and 3, a semiconductor processing system 10 includes a semiconductor processing chamber 12, a wafer handling or support apparatus 14 located within the semiconductor processing chamber, and a lamphead or heat source assembly 16 located on the semiconductor processing chamber.

The semiconductor-processing chamber 12 includes a main body 18 and a window 20 resting on the main body. The window is made of a material that is transparent to infrared light. For example, the window may be made of clear fused silica quartz.

The main body 18 is made of stainless steel and may be lined with quartz (not shown). A circular channel 22 forms part of a base of the main body.

The wafer handling apparatus 14 includes a magnetic rotor 24 within the channel 22, a quartz tubular support 26 resting on or otherwise coupled to the magnetic rotor, and a silicon-coated, silicon carbide graphite edge ring 28 resting on the tubular support. During processing, a wafer or substrate 30 rests on the edge ring.

A magnetic stator 32 is located externally of the channel 22 and is used to magnetically induce rotation of the magnetic rotor through the main body 18. Rotation of the magnetic rotor causes rotation of the edge ring.

The window 20 rests on an upper edge of the main body 18. An o-ring 34 is located between the window and the main body to provide an air-tight seal at the interface.

The lamphead assembly 16 overlies the window 20. An o-ring 35 is located between the window and the lamphead to provide an airtight seal at that interface. The lamphead includes a plurality lamps 36 (like lamp 80A)that are supported by electrical sockets 38. In one embodiment, the lamps 36 are infrared radiation emitting light bulbs. Each lamp is potted with a ceramic potting compound 37. The potting compound is relatively porous.

The lamps are located inside of reflectors 40. A reflector may comprise a sleeve located in a light pipe. The sleeves are made of any suitable light reflecting material such gold-plated stainless steel. The open end of the reflectors, as shown, are located adjacent window 20.

A cooling chamber 42 is defined by upper and lower chamber walls 44 and 46, respectively, and a cylindrical wall 48. A coolant, such as water, is introduced into the chamber via an inlet 50 and is removed at an outlet 52. Referring particularly to FIG. 3, the fluid travels in the space between the reflectors and serves to cool the reflectors. Baffles 54 may be included to ensure proper flow of the coolant through the chamber.

Clamps 56 secure the window 20, the lamphead 16 and the process chamber 12 to one another.

Sensors, such as one or more pyrometers 58, are located in a reflective lower wall 59 of the main body 18 and are positioned to detect a temperature at a lower surface of the wafer 30. Each pyrometer is connected to a power supply controller 60, which controls the power supplied to each of the infrared lamps 36 in response to a measured temperature. Such a control system is described in U.S. Pat. No. 5,755,511, assigned to the assignee of the present invention, the entire disclosure of which is incorporated herein by reference.

The main body of the processing chamber 12 includes a processing gas inlet port 62 and a gas outlet port 64. In use, the pressure within the processing chamber can be reduced to a sub-atmospheric pressure prior to introducing a process gas through the inlet port 62. The process chamber is evacuated by pumping through a conduit or port 66 by means of a vacuum pump 67 and a valve 63. The pressure is typically reduced to between about 1 and 160 torr. Certain processes may be run at atmospheric pressure, and the process chamber will not need to be evacuated for these processes.

Another vacuum pump, vacuum pump 68, is provided to reduce the pressure within the lamphead assembly 16. The pressure within the lamphead assembly is reduced by pumping through a conduit or port 69, including a valve 65, which extends through the cooling chamber 42 and is in fluid communication with an interior space of one of the reflectors 40. As shown in FIG. 4, the interior space of this particular reflector is, in turn, in fluid communication with the interiors of the other reflectors via small passageways 70, which extend through the walls of the reflectors.

Alternatively, the passageways 70 may be eliminated. The interior spaces of the reflectors are then in fluid communication with each other by means of the spaces and voids that are present in the lamphead assembly.

A pressurized source of a thermally conductive gas 75, such as helium, is provided to fill the lamphead assembly with the thermally conductive gas. The source 75 is connected to the lamphead assembly by means of a port or conduit 76 and a valve 77. The thermally conductive gas is introduced into a space 78 formed between a lamphead cover 80 and the base of each lamp. Opening the valve causes the gas to flow into this space. The valve may remain open until the lamphead is substantially filled with the thermally conductive gas. Since the lamp potting compound is porous, the thermally conductive gas flows through the potting compound and around the walls of each lamp to cool the lamp.

As noted, the window 20 is typically made of quartz. Quartz has a high compressive strength, but a relatively low tensile strength. Therefore, if the window is not thick enough, a significant pressure differential across it can cause it to break or fracture.

The present invention may also be used with a non-evacuable lamphead configuration of the type shown in above-mentioned U.S. Pat. No. 5,155,336, assigned to the assignee of the present invention and the entire disclosure of which is incorporated herein by reference. Here, since the lamphead is not evacuated, the thermally conductive gas from a pressurized source is introduced to the lamphead through an inlet port and exhausted through an exhaust port, which is coupled to a vacuum pump, to maintain a flow of gas through the lamphead.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

What is claimed is:

1. A semiconductor processing system, comprising:
   a process chamber having a window, the process chamber further comprising a support on which a substrate may be positioned during processing;
   an assembly chamber that includes a plurality of radiant energy sources, the assembly chamber located on a side of the window opposite from that of the support to direct radiant energy through the window and onto a substrate on the support;
   a gas source that supplies the assembly chamber with a thermally conductive gas to cool the plurality of radiant energy sources; and
   a vacuum pump to evacuate the assembly chamber.

2. The system of claim 1, wherein a substantial percentage of said thermally conductive gas is helium.

3. The system of claim 1 wherein the assembly chamber includes reflectors to direct light from the plurality of radiant energy sources into the process chamber and the reflectors extend into a cooling chamber through which a coolant can be circulated.

4. The system of claim 3 wherein the interior spaces of the reflectors are in fluid communication with each other.

5. An apparatus for processing a substrate, comprising:
   a chamber having at least one wall;
   a window sealed to the at least one wall of said chamber;
   a heat source assembly including a plurality of radiant energy sources serving to radiate regions of a substrate within said chamber with a pattern of radiation intensity, said heat source assembly joined to said window;
   means for filling said heat source assembly with a thermally conductive gas, the thermally conductive gas cooling the plurality of radiant energy sources; and
   a vacuum pump to evacuate the chamber.

6. The apparatus of claim 5, wherein the means for filling said heat source assembly includes a pressurize gas source.

7. A system for the rapid thermal processing of a substrate, comprising:
   a process chamber having a window;
   an assembly chamber that includes a plurality of radiant energy sources and reflectors disposed outside of said process chamber adjacent to the window to direct radiant energy through the window onto a substrate in said process chamber;
   a gas source to fill said assembly chamber with a thermally conductive gas to cool the plurality of radiant energy sources; and
   a vacuum pushup to evacuate the assembly chamber.

8. A method for cooling an assembly chamber that includes a plurality of radiant energy sources in a semiconductor processing system, comprising: filling the assembly chamber with a thermally conductive gas to reduce the temperature at the walls of the plurality of radiant energy sources, the assembly chamber including a vacuum pump to evacuate said chamber.

9. The method of claim 4, wherein the thermally conductive gas is exhausted from the assembly chamber.

10. The system of claim 2, wherein the assembly chamber is maintained at a pressure of about 10 torr, wherein a pressure of helium within the assembly chamber is between about 3 torr and about 10 torr.

11. The apparatus of claim 5, wherein a substantial percentage of said thermally conductive gas is helium.

12. The apparatus of claim 11, wherein the heat source assembly is maintained at a pressure of about 10 torr, wherein a pressure of helium within the assembly chamber is between about 3 torr and about 10 torr.

13. The system of claim 7, wherein a substantial percentage of said thermally conductive gas is helium.

14. The system of claim 13, wherein the assembly chamber is maintained at a pressure of about 10 torr, wherein a pressure of helium within the assembly chamber is between about 3 torr and about 10 torr.

15. A method for cooling a lamp in an assembly chamber in a semiconductor processing system, comprising:
   evacuating the assembly chamber;
   restoring the pressure within the assembly chamber with a thermally conductive gas; and
   operating said lamp in accordance with a recipe; wherein said assembly chamber includes a liquid cooling system having a cooling liquid and said thermally conductive gas transfers heat from said plurality of radiant energy sources to said cooling liquid.

16. The method of claim 15, wherein said restoring step comprises filling said assembly chamber with said thermally conductive gas until a partial pressure of said thermally conductive gas within the assembly chamber is between about 3 torr and about 10 torr.

17. The method of claim 15, wherein said thermally conductive gas is helium.

18. A semiconductor processing system, comprising:

a process chamber having a window, the process chamber further comprising a support on which a substrate may be positioned during processing;

an assembly chamber that includes a plurality of radiant energy sources, the assembly chamber located on a side of the window opposite from that of the support to direct radiant energy through the window and onto a substrate on the support; and a gas source that supplies the assembly chamber with a thermally conductive gas to cool the plurality of radiant energy sources; wherein the assembly chamber is evacuated.

19. The semiconductor processing system of claim 18, wherein the thermally conductive gas is helium.

* * * * *